(12) United States Patent
Mos et al.

(10) Patent No.: US 7,724,370 B2
(45) Date of Patent: May 25, 2010

(54) METHOD OF INSPECTION, A METHOD OF MANUFACTURING, AN INSPECTION APPARATUS, A SUBSTRATE, A MASK, A LITHOGRAPHY APPARATUS AND A LITHOGRAPHIC CELL

(75) Inventors: Everhardus Cornelis Mos, Best (NL); Arie Jeffrey Den Boef, Waalre (NL); Maurits Van Der Schaar, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 142 days.

(21) Appl. No.: 11/712,556

(22) Filed: Mar. 1, 2007

(65) Prior Publication Data

US 2008/0212097 A1    Sep. 4, 2008

(51) Int. Cl.
*G01B 11/00* (2006.01)
*G03B 27/32* (2006.01)
*G03F 9/00* (2006.01)

(52) U.S. Cl. .................. 356/400; 356/401; 355/77; 430/22

(58) Field of Classification Search ................ None
See application file for complete search history.

(56) References Cited

U.S. PATENT DOCUMENTS

| | | | |
|---|---|---|---|
| 5,646,452 A | 7/1997 | Narimatsu | 257/797 |
| 5,703,692 A | 12/1997 | McNeil et al. | 356/445 |
| 5,880,838 A | 3/1999 | Marx et al. | 356/351 |
| 5,963,329 A | 10/1999 | Conrad et al. | 356/372 |
| 6,608,690 B2 | 8/2003 | Niu et al. | 356/635 |
| 6,699,624 B2 | 3/2004 | Niu et al. | 430/5 |
| 6,704,661 B1 | 3/2004 | Opsal et al. | 702/27 |
| 6,721,691 B2 | 4/2004 | Bao et al. | 702/189 |
| 6,738,138 B2 | 5/2004 | Wei | 356/369 |
| 6,753,961 B1 | 6/2004 | Norton et al. | 356/364 |
| 6,768,983 B1 | 7/2004 | Jakatdar et al. | 706/46 |
| 6,772,084 B2 | 8/2004 | Bischoff et al. | 702/127 |
| 6,785,638 B2 | 8/2004 | Niu et al. | 702/189 |
| 6,813,034 B2 | 11/2004 | Rosencwaig et al. | 356/601 |
| 6,819,426 B2 | 11/2004 | Sezginer et al. | 356/401 |
| 6,856,408 B2 | 2/2005 | Raymond | 356/601 |
| 6,864,589 B2 | 3/2005 | Ulrich | 257/797 |
| 6,919,964 B2 | 7/2005 | Chu | 356/601 |
| 6,928,628 B2 | 8/2005 | Seligson et al. | 716/4 |
| 6,972,852 B2 | 12/2005 | Opsal et al. | 356/625 |
| 6,974,962 B2 | 12/2005 | Brill et al. | 250/548 |
| 6,982,793 B1 * | 1/2006 | Yang et al. | 356/401 |
| 6,987,572 B2 | 1/2006 | Lakkapragada et al. | 356/601 |
| 7,046,376 B2 | 5/2006 | Sezginer | 356/601 |
| 7,061,615 B1 | 6/2006 | Lowe-Webb | 356/401 |

(Continued)

FOREIGN PATENT DOCUMENTS

EP    1 628 164 A2    2/2006

*Primary Examiner*—Tarifur Chowdhury
*Assistant Examiner*—Gordon J Stock, Jr.
(74) *Attorney, Agent, or Firm*—Sterne, Kessler, Goldstein & Fox P.L.L.C.

(57) ABSTRACT

Each target used in a method of measuring overlay using a scatterometer includes a first portion and a second portion, the first portion has features varying only in a first direction and the second portion has features only varying in a second direction. The first and second directions are orthogonal, thus eliminating cross talk between the directions, and improving the accuracy of overlay error calculations.

10 Claims, 5 Drawing Sheets

U.S. PATENT DOCUMENTS

| | | |
|---|---|---|
| 7,061,623 B2 | 6/2006 | Davidson .................... 356/497 |
| 7,061,627 B2 | 6/2006 | Opsal et al. ................. 356/601 |
| 7,068,363 B2 | 6/2006 | Bevis et al. ............. 356/237.5 |
| 7,193,715 B2 * | 3/2007 | Smedt et al. ................ 356/401 |
| 7,317,531 B2 * | 1/2008 | Mieher et al. ............... 356/401 |
| 2004/0119970 A1 | 6/2004 | Dusa et al. .............. 356/237.1 |
| 2004/0246482 A1 | 12/2004 | Sezginer et al. ............ 356/401 |
| 2005/0106479 A1 * | 5/2005 | Geh et al. ..................... 430/30 |
| 2005/0231722 A1 | 10/2005 | Ausschnitt et al. .......... 356/401 |
| 2006/0033921 A1 | 2/2006 | Den Boef et al. ........... 356/446 |
| 2006/0066855 A1 | 3/2006 | Den Boef et al. ........... 356/401 |
| 2006/0126074 A1 | 6/2006 | Van Der Werf et al. ..... 356/489 |
| 2006/0139592 A1 | 6/2006 | Den Boef et al. ............. 355/53 |
| 2007/0052113 A1 * | 3/2007 | Marokkey et al. ........... 257/797 |

* cited by examiner

MS

MS

METHOD OF INSPECTION, A METHOD OF MANUFACTURING, AN INSPECTION APPARATUS, A SUBSTRATE, A MASK, A LITHOGRAPHY APPARATUS AND A LITHOGRAPHIC CELL

FIELD

The present invention relates to methods of inspection usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Such a system of illuminating a target and collecting data from the reflected radiation is often used to calculate the overlay error, OV for a pattern. This can be achieved by forming a plurality of superimposed gratings on the substrate and measuring the overlay error between the gratings. To measure the overlay in, for example, the X direction, a grating varying in the X direction, as shown in FIG. 9a of the accompanying drawings is used. To measure overlay in, for example, the Y direction, a grating varying in the Y direction, as shown in FIG. 9b of the accompanying drawings is used. Each of these targets occupies an area on the substrate that could otherwise be used for other patterns, such as those that form the basis for an integrated circuit, and thus occupies valuable space.

An alternative target pattern is shown in FIG. 10 of the accompanying drawings. In this target, the pattern varies in both the X and Y direction and therefore only one target is used. However, cross-talk between the X and Y directions occurs when this target is used, thus reducing the accuracy of the results and increasing the complexity of the computation of the results.

SUMMARY

It is desirable to provide an alternative target in which both the area of the substrate used and cross-talk are minimized.

According to an embodiment of the invention, there is provided a method of inspection to determine the overlay error in a substrate including projecting a beam of radiation onto a target on the substrate, measuring the reflected radiation reflected from the target on the substrate using a scatterometer; and determining the overlay error from the reflected radiation; wherein the target includes first and second overlapping patterns, each pattern including a first sub-pattern having features which vary only in a first direction and a second sub-pattern having features which vary only in a second direction, the target being arranged to determine the overlay in a plurality of direction within a single measurement.

According to an embodiment of the invention there is provided an inspection apparatus configured to measure a property of a substrate, the apparatus including: a radiation projector configured to project radiation on to a target on the substrate; a detector configured to detect the radiation reflected from the target; a data handling unit, wherein the data handling unit is configured to calculate the overlay error in two directions from the radiation reflected from a single target including first and second overlying patterns, each including a first portion including a sub-pattern which varies only in a first direction and a second portion including a sub-pattern which varies only in a second direction.

According to an embodiment of the invention there is provided a substrate having printed thereon a target to be used to determine the overlay in a plurality of directions within a single measurement, the target including first and second overlying patterns, each including a first sub-pattern having features which vary only in a first direction and a second sub-pattern having features which vary only in a second direction.

According to an embodiment of the invention there is provided a mask for use in printing a target on a substrate, the mask including a pattern representing a target including first and second overlying patterns, each including a first sub-pattern having features which vary only in a first direction and a second sub-pattern having features which vary only in a second direction.

According to an embodiment of the invention, there is provided a lithographic apparatus including an illumination system configured to condition a beam of radiation; a support configured to hold a patterning device, the patterning device configured to pattern the beam of radiation to form a patterned beam of radiation; a substrate table configured to support a substrate; a projection system configured to project the patterned beam of radiation onto the substrate; and an inspection apparatus configured to measure a property of the substrate, the inspection apparatus including a radiation projector configured to project radiation on to a target on the substrate; a detector configured to detect the radiation reflected from the target; a data handling unit configured to calculate an overlay error in two directions from the radiation reflected from a single target including first and second overlying patterns, each pattern comprising a first portion including a sub-pattern which varies only in a first direction and a second portion including a sub-pattern which varies only in a second direction.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1A:
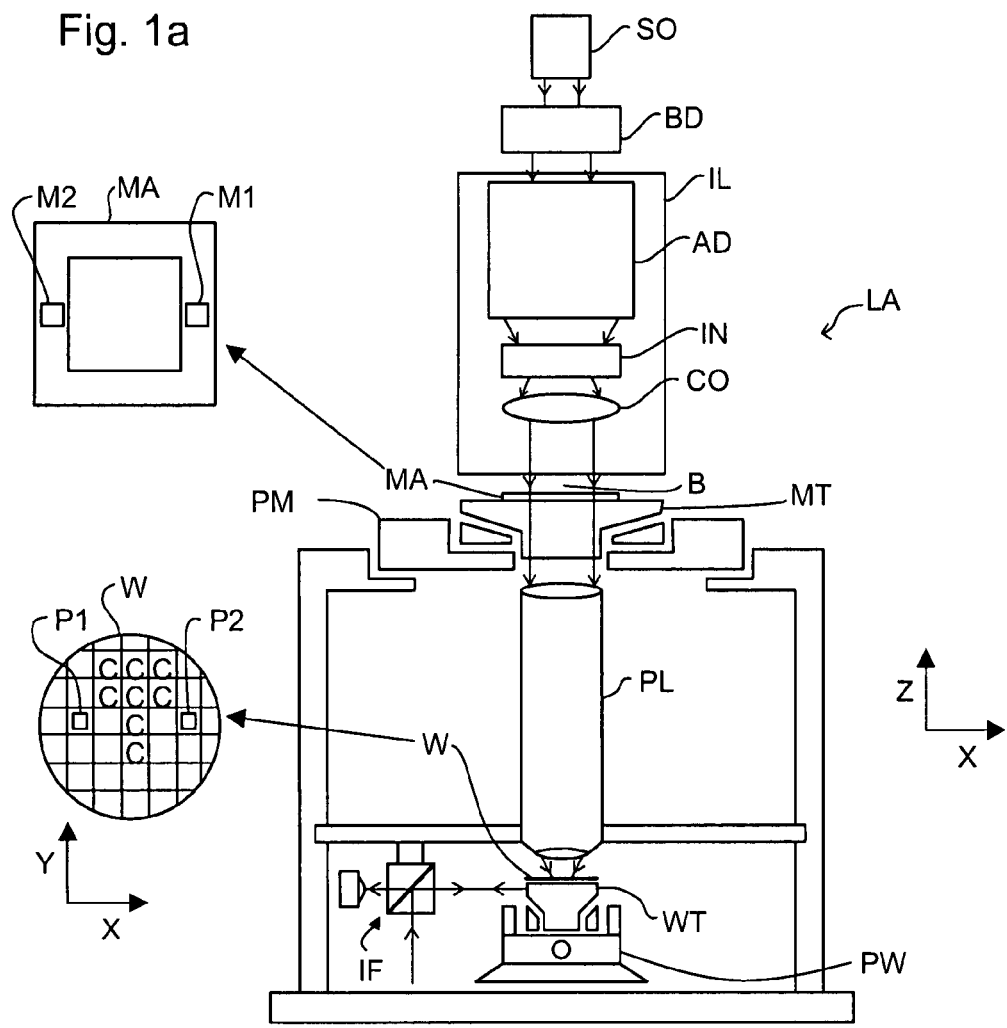
FIG. 1a depicts a lithographic apparatus in accordance with an embodiment of the invention.

FIG. 1a schematically depicts a lithographic apparatus. The apparatus includes an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the patterning device (e.g. mask MA), the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1a) can be used to accurately position the patterning device (e.g. mask MA) with respect to the path of the radiation beam B, e.g. after mechanical retrieval from a mask library, or during a scan. In general, movement of the support structure MT (e.g. mask table) may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT (e.g. mask table) may be connected to a short-stroke actuator only, or may be fixed. Patterning device MA (e.g. mask) and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA (e.g. mask), the mask alignment marks may be located between the dies.

The depicted apparatus could be used in at least one of the following modes:

1. In step mode, the support structure MT (mask table) and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT (e.g. mask table) and the substrate table WT are scanned synchronously while a pattern imparted to the radiation beam is projected onto a target portion C (i.e. a single dynamic exposure). The velocity and direction of the substrate table WT relative to the support structure MT (e.g. mask table) may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT (e.g. mask table) is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
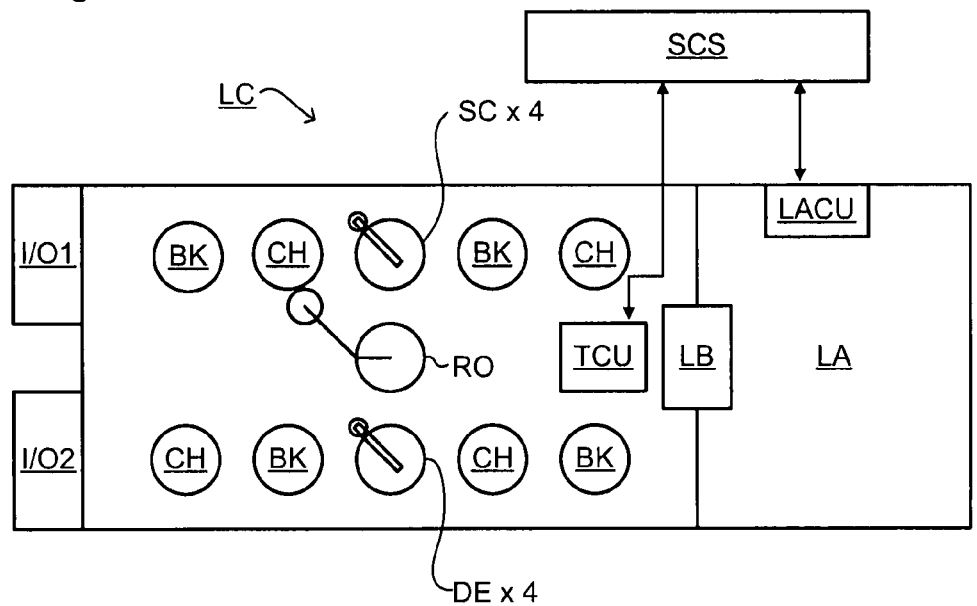
FIG. 1b depicts a lithographic cell or cluster in accordance with an embodiment of the invention.

As shown in FIG. 1b, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers them to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded—thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB)

which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 2:
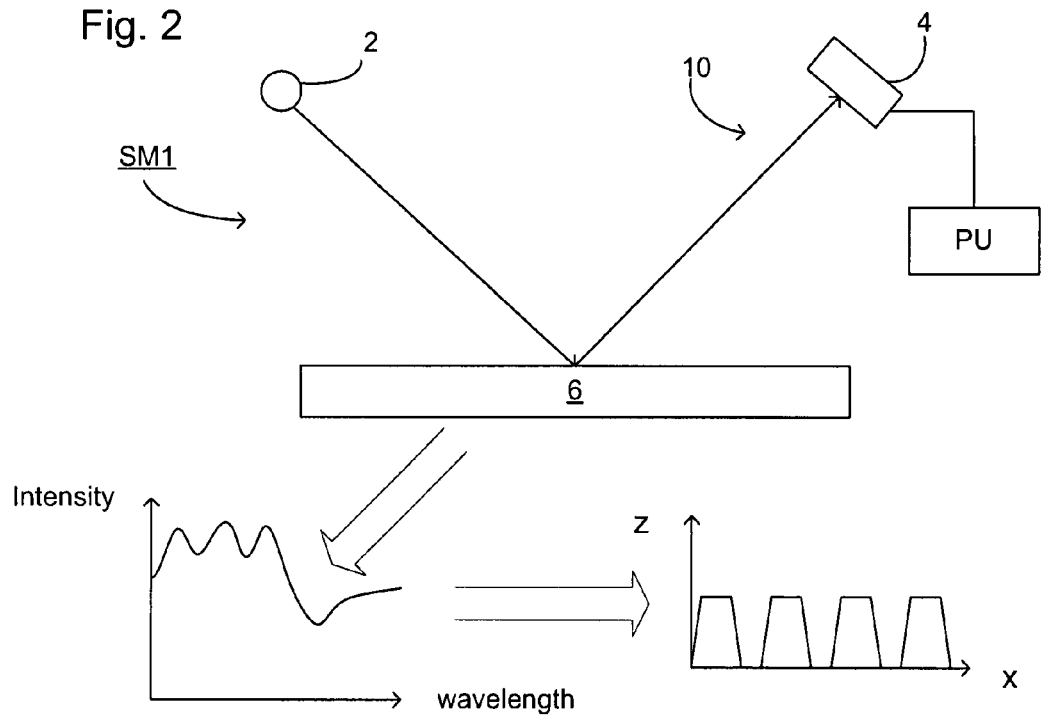
FIG. 2 depicts a scatterometer in accordance with an embodiment of the invention.

FIG. 2 depicts a scatterometer SM1 which may be used in an embodiment of the present invention. It includes a broadband (white light) radiation projector 2 which projects radiation onto a substrate 6. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 2. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 3:
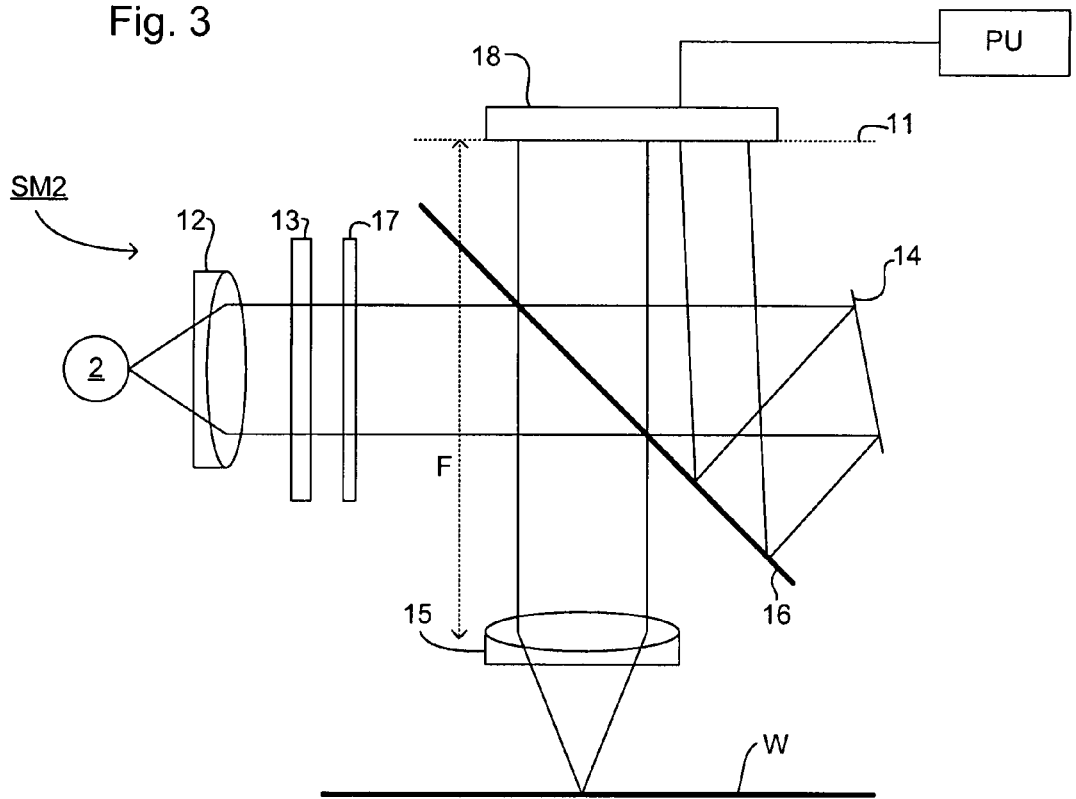
FIG. 3 depicts a scatterometer in accordance with an embodiment of the invention.

Another scatterometer SM2 that may be used in an embodiment of the present invention is shown in FIG. 3. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length F of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of the substrate target can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than including a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of $\delta\lambda$ and a spacing of at least $2\delta\lambda$ (i.e. twice the wavelength). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A, hereby incorporated in its entirety by reference.

The target on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

Figure 4:
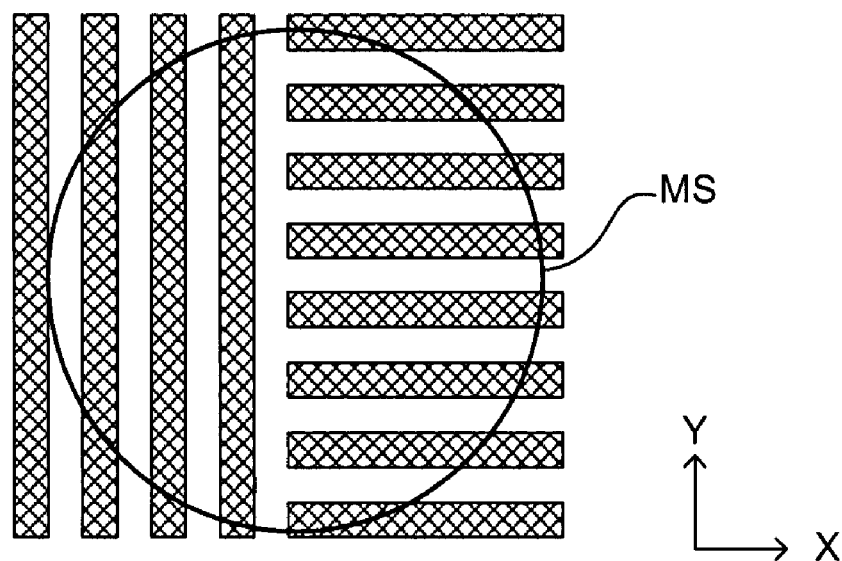
FIG. 4 depicts a target according to an embodiment of the invention.

As can be seen in FIG. 4, a target according to an embodiment of the invention includes two parts: a first part with gratings in a first direction and a second part with gratings in a second direction. The first and second directions are preferably orthogonal, but this is not essential, some deviation from orthogonality can be accommodated by a vector decomposition of the measurements. The gratings are arranged perpendicularly such that the asymmetry of the overlying gratings in the X direction is a function only of the X overlay and the asymmetry in the Y direction is a function only of the Y overlay. As there are no mixed orders there will be no crosstalk between the directions. As can be seen, at least part of each of the grating in the X direction and the grating in the Y direction fall within the measurement spot MS and so can be simultaneously measured by the measurement beam. However, the cross-section of the measurement beam, and hence the measurement spot, is smaller than the target as a whole so does not extend across two targets.

Figure 5:
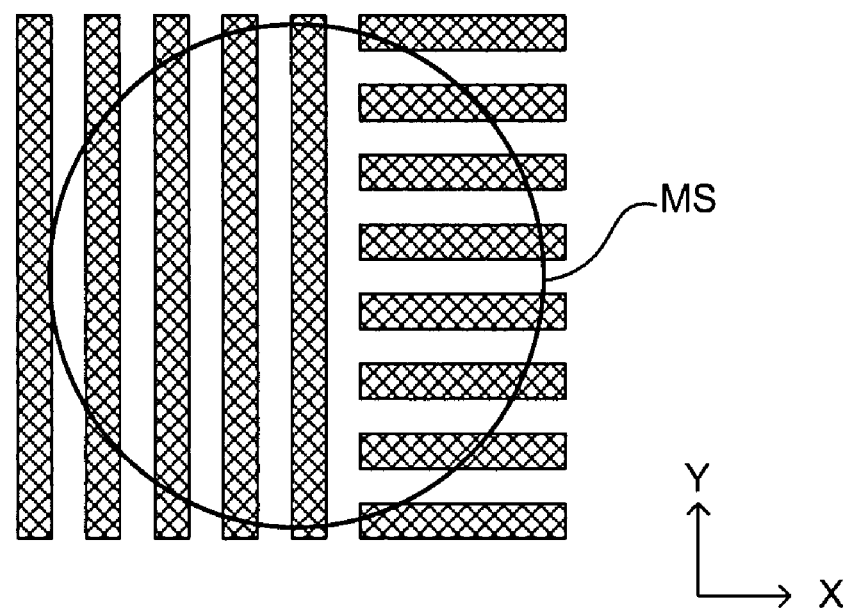
FIG. 5 depicts a detailed view of an arrangement of target sites according to an embodiment of the invention.
Figure 6A:
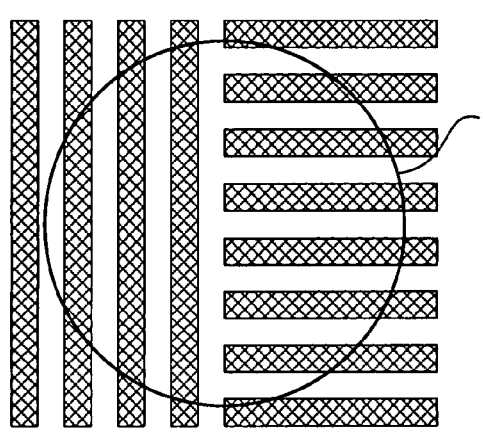
FIGS. 6a-b depict an alternative target according to an embodiment of the invention.
Figure 6B:
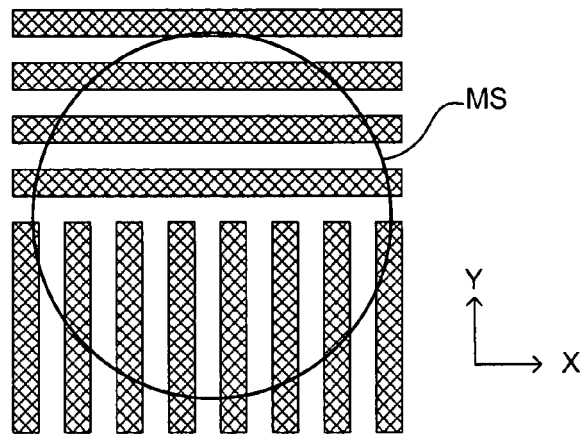
Figure 7A:
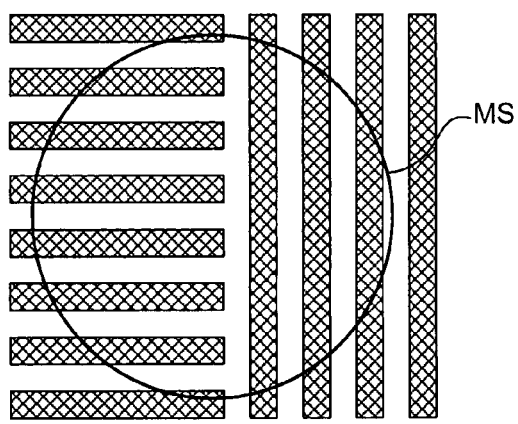
FIGS. 7a-b depict an alternative target according to an embodiment of the invention.
Figure 7B:
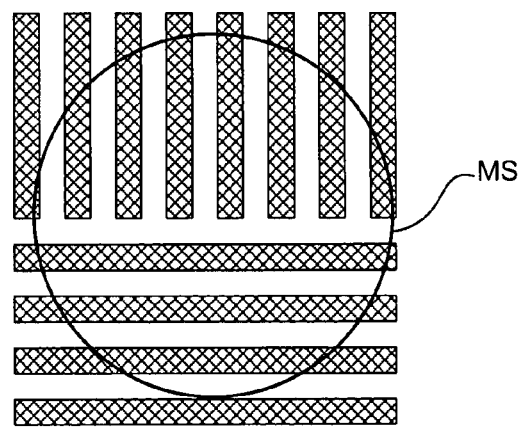

As the number of lines in the X and Y directions are not equal, the signal strength (and thus the accuracy) will not be equal for both the X and Y overlay errors. This may be partially overcome by changing the relative proportion of lines in the X direction and Y direction, as shown in FIG. 5. An alternative method of overcoming the differential signal strength is to alternate the orientation of the targets in the field, as shown in FIGS. 6a and 6b. In FIG. 6a the resulting signal strength in the Y direction would be stronger, whereas when the target shown in FIG. 6b is used the resulting signal strength would be stronger in the X direction. To account for inaccuracies resulting from the apparatus it is often desirable to measure the overlay error using a different target orientation and in FIGS. 7a and 7b the targets shown in FIGS. 6a and 6b have been rotated by 180° for this purpose.

Figure 8A:
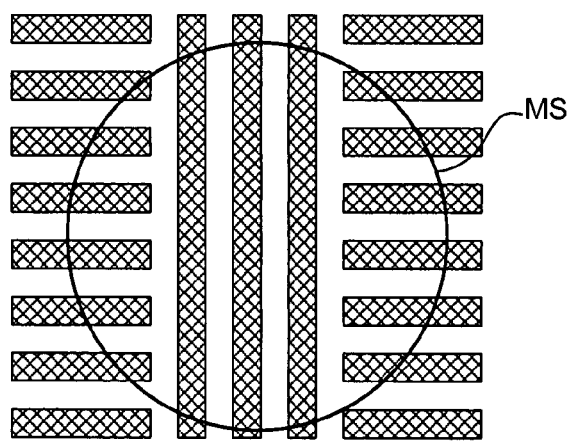
FIGS. 8a-b depict an alternative target according to an embodiment of the invention.
Figure 8B:
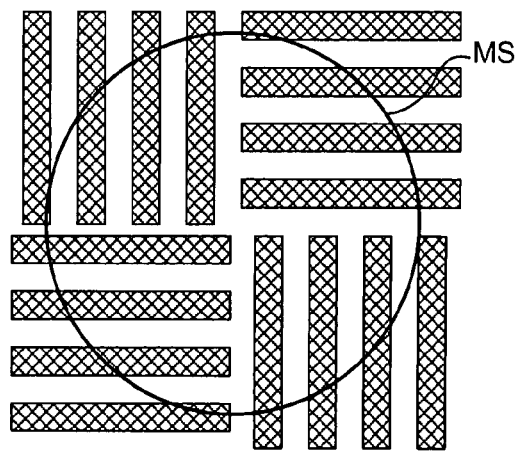
Figure 9A:
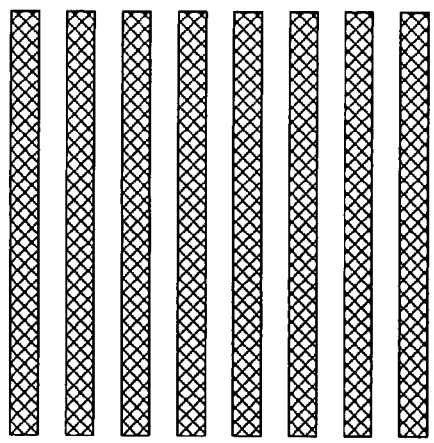
FIGS. 9a-b depict a conventional target.
Figure 9B:
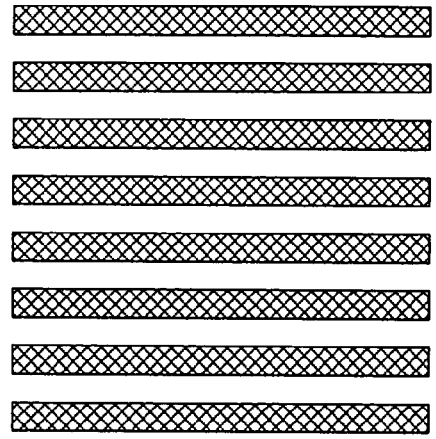
Figure 10:
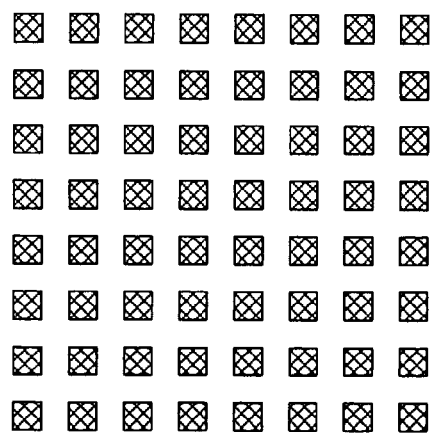
FIG. 10 depicts a conventional target.

Alternative targets, with different X and Y divisions can be seen in FIGS. 8a and 8b. The different divisions can be used to adjust the relative signal strengths used in measurement of the X and Y overlay errors. Embodiments of the invention are not limited to arrangements depicted but any X and Y divisions could be used. A scatterometer, e.g. as described above can be adapted to use the targets in accordance with embodiments of the invention by provision of appropriate software, or a library of spectra, to enable determination of the overlay error from the spectra obtained from the targets.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of inspection to determine an overlay error in a substrate comprising:
    projecting a beam of radiation onto a target on the substrate;
    measuring the radiation reflected from the target on the substrate using a scatterometer; and
    determining the overlay error from the reflected radiation;
    wherein the target comprises first and second overlapping patterns, each pattern comprising a first sub-pattern having features which vary in a first direction, a second sub-pattern having features which vary in a second direction, and a third sub-pattern having features which vary in either the first direction or the second direction, the target being arranged to determine the overlay in a plurality of directions within a single measurement, and
    wherein the beam of radiation forms a measurement spot on the substrate, the measurement spot covering at least a part of each of the sub-patterns.

2. The method of claim 1, wherein the first and second directions are substantially orthogonal.

3. The method of claim 1, wherein the first and second overlapping patterns are substantially identical.

4. The method of claim 1, wherein the first and second sub-patterns comprise gratings.

5. The method of claim 1, wherein each pattern comprises four sub-patterns arranged in a checkerboard arrangement, each sub-pattern comprising a pattern having features which vary only in either the first or the second direction.

6. A method of manufacturing a device on a substrate, the method comprising:
    projecting a patterned beam of radiation onto the substrate to expose the substrate wherein exposure of the substrate is based on an overlay error determined by:
        projecting a beam of radiation onto a target on the substrate,
        measuring the radiation reflected from the target on the substrate using a scatterometer, and
        determining the overlay error from the reflected radiation,
    wherein the target comprises first and second overlapping patterns, each pattern comprising a first sub-pattern having features that vary in a first direction, a second sub-pattern having features that vary in a second direction, and a third sub-pattern having features which vary in either the first direction or the second direction, the target being arranged to determine the overlay in a plurality of directions within a single measurement, and
    wherein the beam of radiation forms a measurement spot on the substrate, the measurement spot covering at least a part of each of the sub-patterns.

7. An inspection apparatus configured to measure a property of a substrate, the apparatus comprising:
    a radiation projector configured to project radiation onto a target on the substrate;
    a scatterometer detector configured to detect the radiation reflected from the target; and
    a data handling unit configured to determine an overlay error in two directions from the radiation reflected from the target comprising first and second overlying patterns, each pattern comprising a first portion comprising a sub-pattern which varies in a first direction, a second portion comprising a sub-pattern which varies in a second direction, and a third portion comprising a sub-pattern which varies in either the first direction or the second direction,
    wherein the radiation forms a measurement spot on the substrate, the measurement spot covering at least a part of each of the sub-patterns.

8. A lithography apparatus comprising:

a projection system configured to project an image of a pattern onto a substrate and an inspection apparatus comprising,
- a radiation projector configured to project radiation onto a target on the substrate;
- a scatterometer detector configured to detect the radiation reflected from the target; and
- a data handling unit configured to determine an overlay error in two directions from the radiation reflected from the target comprising first and second overlying patterns, each pattern comprising a first portion comprising a sub-pattern that varies in a first direction, a second portion comprising a sub-pattern that varies in a second direction, and a third portion comprising a sub-pattern that varies in either the first direction or the second direction, wherein the radiation forms a measurement spot on the substrate, the measurement spot covering at least a part of each of the sub-patterns.

9. A lithographic cell comprising:

a lithographic apparatus, a process unit configured to perform a chemical process on a substrate exposed by the lithographic apparatus and an inspection apparatus comprising,
- a radiation projector configured to project radiation onto a target on the substrate;
- a scatterometer detector configured to detect the radiation reflected from the target; and
- a data handling unit configured to determine an overlay error in two directions from the radiation reflected from the target comprising first and second overlying patterns, each pattern comprising a first portion comprising a sub-pattern that varies in a first direction, a second portion comprising a sub-pattern that varies in a second direction, and a third portion comprising a sub-pattern that varies in either the first direction or the second direction, wherein the radiation forms a measurement spot on the substrate, the measurement spot covering at least a part of each of the sub-patterns.

10. A lithographic apparatus comprising:

an illumination system configured to condition a beam of radiation;

a support configured to hold a patterning device, the patterning device configured to pattern the beam of radiation to form a patterned beam of radiation;

a substrate table configured to support a substrate;

a projection system configured to project the patterned beam of radiation onto the substrate; and an inspection apparatus configured to measure a property of the substrate, the inspection apparatus comprising,
- a radiation projector configured to project radiation on to a target on the substrate,
- a scatterometer detector configured to detect the radiation reflected from the target;
- a data handling unit configured to determine an overlay error in two directions from the radiation reflected from the target comprising first and second overlying patterns, each pattern comprising a first portion comprising a sub-pattern which varies in a first direction, a second portion comprising a sub-pattern which varies in a second direction, and a third portion comprising a sub-pattern which varies in either the first direction or the second direction, wherein the radiation projected onto the target forms a measurement spot on the substrate, the measurement spot covering at least a part of each of the sub-patterns.

* * * * *